(12) United States Patent
Takeshita et al.

(10) Patent No.: US 6,190,459 B1
(45) Date of Patent: Feb. 20, 2001

(54) GAS TREATMENT APPARATUS

(75) Inventors: Kazuhiro Takeshita, Kumamoto; Shinji Nagashima, Kumamoto-ken; Yoji Mizutani, Kawasaki; Kyoshige Katayama, Kumamoto, all of (JP)

(73) Assignee: Tokyo Electron Limited, Tokyo (JP)

( * ) Notice: Under 35 U.S.C. 154(b), the term of this patent shall be extended for 0 days.

(21) Appl. No.: 09/210,854

(22) Filed: Dec. 15, 1998

(30) Foreign Application Priority Data

Jan. 7, 1998 (JP) .................................................. 10-013218
Mar. 11, 1998 (JP) .................................................. 10-078395

(51) Int. Cl.[7] .................................................. C23K 16/00
(52) U.S. Cl. ............................................................ 118/715
(58) Field of Search ............................... 118/715; 156/345

(56) References Cited

U.S. PATENT DOCUMENTS

| | | |
|---|---|---|
| 5,470,802 | 11/1995 | Gnade et al. . |
| 5,494,858 | 2/1996 | Gnade et al. . |
| 5,540,772 * | 7/1996 | McMillan et al. ...................... 118/50 |
| 5,688,565 * | 11/1997 | McMillan et al. .................... 427/565 |
| 5,830,623 * | 11/1998 | Maruyama et al. .................. 430/322 |
| 5,846,597 * | 12/1998 | Derbenwick et al. .................. 427/96 |
| 5,858,526 * | 1/1999 | Floch et al. ........................... 428/327 |
| 6,090,209 * | 1/2000 | Strodtbeck et al. ................. 118/715 |

FOREIGN PATENT DOCUMENTS

| | | |
|---|---|---|
| 8-59362 | 3/1996 | (JP) . |
| 8-162450 | 6/1996 | (JP) . |

* cited by examiner

*Primary Examiner*—Jeffrie R. Lund
(74) *Attorney, Agent, or Firm*—Oblon, Spivak, McClelland, Maier & Neustadt, P.C.

(57) ABSTRACT

A gas flow regulating surface portion 37a is the farthest from the front surface of a wafer W in the middle between a peripheral portion of the wafer W and a center portion of a sealing vessel. The gas flow regulating portion 37a protrudes to the front surface of the wafer W in the vicinity of a center portion that surrounds an exhausting opening 35a. In other words, a convex portion 37c is formed in a peripheral area of the gas flow regulating surface portion 37a that surrounds the exhausting opening 35a. Since treatment gas flows along the front surface of the gas flow regulating portion 37a, treatment gas equally contacts the wafer W in the radius direction of the wafer W. Thus, a film with equal thickness is formed.

13 Claims, 12 Drawing Sheets

AMMONIA

ETHYL ALCOHOL
HMDS
HEPTANE

GAS TREATMENT APPARATUS

BACKGROUND OF THE INVENTION

1. Field of the Invention

The present invention relates to a gas treatment apparatus for gelatinizing a coated film coated on the front surface of a substrate and forming an insulation film, the coated film being formed by dispersing particles or colloid of a start substance of a film component to solvent.

2. Description of the Related Art

As methods for forming an inter-layer insulation film of a semiconductor device, CVD method, heat oxidizing method, and so forth are known. In addition, sol-gel method is known. In the sol-gel method, a coating solution of which colloid of TEOS (tetraethoxysilane: $Si(C_2H_5O)_4$) is dispersed to organic solvent such as ethanol solution is coated on the front surface of a semiconductor wafer (hereinafter simply referred to as wafer). The coated film is gelatinized and dried. Thus, a silicon oxide film is obtained. An example of such a method has been disclosed in Japanese Patent Laid-Open Publication Nos. 8-162450 and 8-59362.

FIGS. 9A, 9B, and 9C show degeneration of a coated film in such a method.

When a coating solution is coated on a wafer, particles or colloid 100 of TEOS is dispersed to solvent 200 (refer to FIG. 9A). Thereafter, the coated film is exposed to alkaline atmosphere or heated. Thus, since TEOS is polycondensated and hydrolyzed, the coated film is gelatinized and thereby a mesh structure of TEOS 300 is formed (refer to FIG. 9B). The solvent of the coated film is substituted with another solvent 400 such as acetone so as to remove moisture from the coating solution (refer to FIG. 9C). The solvent substituting treatment is a hydrophobic treatment for the film. In other words, since an OH radical tends to absorb moisture, when the film is reacted with for example HMDS, the OH radical bound to an edge portion of Si—O coupling is substituted with another organic substance.

After the coating solution is dried, a coated film of silicon oxide film is obtained. Moreover, in the solvent substituting treatment shown in FIG. 9C, solvent whose surface tension is smaller than that of ethanol is used. Thus, when the solvent vaporizes, since large stress is not applied to the mesh structure of TEOS, the film can be prevented from breaking.

The silicon oxide film formed by the sol-gel method has many air pores. Thus, the dielectric constant ∈ of the oxide film is very close to that of vacuum. Consequently, the electric resistance of the oxide film having air pores is as high as that of vacuum. As a result, an ideal insulation film can be obtained.

When the sol-gel method is applied to a real production line, a coating unit that coats a coating solution to a wafer, an aging unit that contacts ammonium gas to the wafer or heats the wafer at a predetermined temperature (for example, around 100° C.) and gelatinizes the coated film, and a substituting unit that substitutes the solvent of the coated film with another solvent are required.

In the gelatinizing treatment performed by the inventor of the present invention, as shown in FIG. 10, a wafer W is placed on a plate 61. A cylindrical lid 62 is placed on the plate 61. Thus, a sealing vessel 6 is formed. Ammonium gas is supplied from a gas supplying path 63 on the periphery of the plate 61. The ammonium gas is exhausted from an exhausting path 64 at the center of the lid 62.

SUMMARY OF THE INVENTION

In the unit shown in FIG. 10, the ammonium gas tends to upwardly flow from the gas supplying opening of the plate 61 along the inner periphery of the lid 62 upwardly. In addition, the ammonium gas is attracted by attracting force of the exhausting path 64 at the center of the lid 61. Thus, a gas flow takes place in an upper diagonal direction. Since gas that upwardly flows along the inner periphery of the lid 62 becomes a vortex flow at upper corners of the lid 62, the gas does not smoothly lower. Thus, the gas flow rate and gas concentration at the center portion of the wafer W are smaller than those at the peripheral portion thereof. Consequently, the coated film is unevenly gelatinized and thereby an unsmooth film is formed.

A first aspect of the present invention is made from the above-described point of view.

An object of the first aspect of the present invention is to provide a coated film treatment apparatus that allows a substrate (for example, a wafer) to be treated with an equal gas flow in a sealing vessel so as to obtain a high-quality thin film (for example, an inter-layer insulation film).

A first aspect of the present invention is a gas treatment apparatus, comprising a sealing vessel for treating a substrate with gas, a substrate holding portion, disposed in the sealing vessel, for holding the substrate, a gas flow regulating surface portion, disposed opposite to a treatment surface of the substrate held on the substrate holding portion, the gas flow regulating surface portion protruding to the substrate holding portion and having at least an outer peripheral portion for forming a narrowed gas path with the substrate holding portion, a gas supplying opening disposed along a peripheral portion of the gas flow regulating surface portion, and an exhausting opening facing the treatment surface of the substrate held on the substrate holding portion and disposed at a center portion of the sealing vessel.

The gas treatment apparatus may further comprises a buffer chamber disposed outside the outer peripheral portion and at an upper portion of the gas supplying opening.

An inner periphery of the gas flow regulating surface portion may be composed of a first concave portion formed in almost a spherical surface shape, a convex portion formed inside the first concave portion and protruding in an almost doughnut shape, and a second concave portion formed in an almost circular cone shape inside the convex portion and connected to the exhausting opening wherein the first concave portion, the convex portion, and the second concave portion are inwardly and continuously formed on concentric circles.

The outer peripheral portion may be a partition plate that partitions an inner space of the sealing vessel into a cylindrical space facing the treatment surface of the substrate held on the substrate holding portion and a buffer chamber formed outside the cylindrical space. In addition, an inner periphery of the gas flow regulating surface portion may be composed of an outer portion formed in an almost plane shape, an inclined portion formed inside the outer portion, the inclined portion forming a side surface of an almost circularly cone shaped protrusion portion, a convex portion formed in an almost doughnut shape inside the inclined portion, and a concave portion formed in an almost circularly cone shape inside the convex portion and connected to the exhausting opening wherein the outer portion, the inclined portion, and the convex portion, and the concave portion are inwardly and continuously formed on concentric circles.

An almost spherical surface shaped concave portion may be formed on an inner periphery of the gas flow regulating surface portion.

A circularly cone shaped concave portion with a vertex of the exhausting opening may be formed on an inner periphery of the gas flow regulating surface portion.

The outer peripheral portion may form a partitioning portion with a cylindrical section wherein an inner periphery of the gas flow regulating surface portion is a plane with almost the same height as a vertex portion of the buffer chamber.

An inner periphery of the gas flow regulating surface portion may be composed of a first concave portion formed in almost a spherical surface shape, a convex portion formed inside the first concave portion and protruding in an almost doughnut shape, and a second concave portion formed in an almost circular cone shape inside the convex portion and connected to the exhausting opening wherein the first concave portion, the convex portion, and the second concave portion are inwardly and continuously formed on concentric circles.

The gas supplying opening may be formed in a slit shape along a peripheral direction of the sealing vessel.

The sealing vessel may be composed of a first member on which the substrate holding portion is disposed, and a second member on which the gas flow regulating surface portion is disposed, the second member being approachable to the first member.

The gas supplying path may be formed through the first member.

A coating solution of which particles or colloid of a start substance of a film component is dispersed to solvent may be coated as a coated film on the substrate wherein gas for accelerating gelatinizing the particles or colloid of the coated film is supplied to the sealing vessel.

The gas is preferably alkaline gas.

Next, a second aspect of the present invention will be described.

When a wafer on which coating solution has been coated as shown in FIGS. 9A, 9B, and 9C is left in a natural condition, the coating solution is gelatinized and a silicon oxide film is formed.

However, to do that, it takes a long time (for example, one night). Thus, such a method is not suitable from a view point of mass-production. As the second aspect of the present invention, a coated film is heated so as to acceleratingly gelatinize it.

When a wafer on which a coated film has been formed is heated at for example around 100° C. and the coated film is gelatinized, since organic solvent vaporizes from the coated film, a predetermined film thickness and film quality cannot be obtained. To solve such a problem, a wafer is placed in a sealing vessel. Saturated vapor of a solvent component (for example, ethylene glycol) of the coated film is supplied to the sealing vessel. Thus, ethylene glycol can be suppressed from vaporizing from the coated film.

In this case, saturated vapor of ethylene glycol at 100° C. is generated and supplied to the sealing vessel that is heated at 100° C. Thus, ethylene glycol can be suppressed from vaporizing. However, when the temperature of gas in a pipe to the sealing vessel drops, condensation takes place. Thus, the saturated vapor cannot be obtained in the sealing vessel. As a result, the solvent component (in this case, ethylene glycol) of the wafer vaporizes. On the other hand, when the temperature of the saturated vapor of ethylene glycol is higher than that in the sealing vessel, the temperature of the saturated vapor drops in the sealing vessel. Thus, concentration may take place and thereby liquid drops may adhere to the wafer. When liquid drops adhere to the wafer, the film thickness at the liquid adhered position varies. Thus, the equality of the film thickness deteriorates. Consequently, in addition to the temperature control of the generation source of the saturated vapor of the solvent component, saturated vapor should be generated in the treatment vessel.

The second aspect of the present invention is made from the above-described point of view.

In other words, an object of the second aspect of the present invention is to provide a gas treatment apparatus that allows a solvent component to be suppressed from vaporizing from a coated film in gelatinizing particles or colloid of the coated film so as to obtain a film (for example, an inter-layer insulation film) with a predetermined film thickness.

A second aspect of the present invention is a gas treatment apparatus, comprising a sealing vessel for holding a substrate coated with a coating solution of which particles or colloid of a start substance of a film component is dispersed to solvent, a heating means for heating the inside of the sealing vessel so as to gelatinize the particles or colloid of a coated film as the coating solution, a gas supplying path for supplying vapor of a solvent component to the sealing vessel, an exhausting path for exhausting gas out of the sealing vessel, a gas dispersing chamber disposed in the middle of the gas supplying path in a wall of the sealing vessel, the gas dispersing member, having a plurality of gas supplying openings, connected to the sealing vessel, for dispersing gas in the gas supplying path to the sealing vessel, the inner temperature of the gas dispersing chamber being kept at almost the same as the inner temperature of the sealing vessel, and a solvent vapor generating portion, heated at a slightly higher temperature than the inner temperature of the gas dispersing chamber, for generating vapor of the solvent component that becomes saturated vapor at the inner temperature of the sealing vessel.

According to the second aspect of the present invention, saturated vapor of a solvent component (for example, ethylene glycol) generated by the solvent vapor generating portion is slightly cooled in the gas dispersing chamber to the almost the same temperature in the sealing vessel. Thus, saturated vapor is securely supplied to the sealing vessel. Consequently, the solvent is suppressed from vaporizing from the coated film. In addition, liquid drops of the vapor are prevented from adhering to the substrate. In this case, the sealing vessel may have a heating plate for holding and heating the substrate. The gas dispersing chamber may be formed in the heating plate.

A modification of the second aspect of the present invention is a gas treatment apparatus, comprising a sealing vessel for holding a substrate coated with a coating solution of which particles or colloid of a start substance of a film component is dispersed to solvent, a heating means for heating the inside of the sealing vessel so as to gelatinize the particles or colloid of a coated film as the coating solution, a gas supplying path for supplying vapor of a solvent component to the sealing vessel, an exhausting path for exhausting gas out of the sealing vessel, a first reservoir tank for reserving solution of the solvent component, bubbling the solution with carrier gas, and supplying vapor of the solvent component to the sealing vessel trough the gas supplying path, a first temperature adjusting means for adjusting the temperature of the solution in the first reservoir tank to a predetermined temperature, a second reservoir tank for replenishing the solution to the first reservoir tank when the amount of the solution in the first reservoir tank decreases, and a second temperature adjusting means for adjusting the temperature of the solution in the second reservoir tank to a predetermined temperature.

According to the present invention, the temperature of the solution of the solvent component can be accurately controlled. Thus, the vapor of the solvent component at a predetermined temperature can be supplied to the sealing vessel. In the present invention, alkaline gas for accelerating gelatinizing the coated film may be supplied to the sealing vessel.

These and other objects, features and advantages of the present invention will become more apparent in light of the following detailed description of a best mode embodiment thereof, as illustrated in the accompanying drawings.

DESCRIPTION OF PREFERRED EMBODIMENTS

Next, with reference to the accompanying drawings, embodiments of the present invention will be described.

(First Embodiment)

Figure 1:
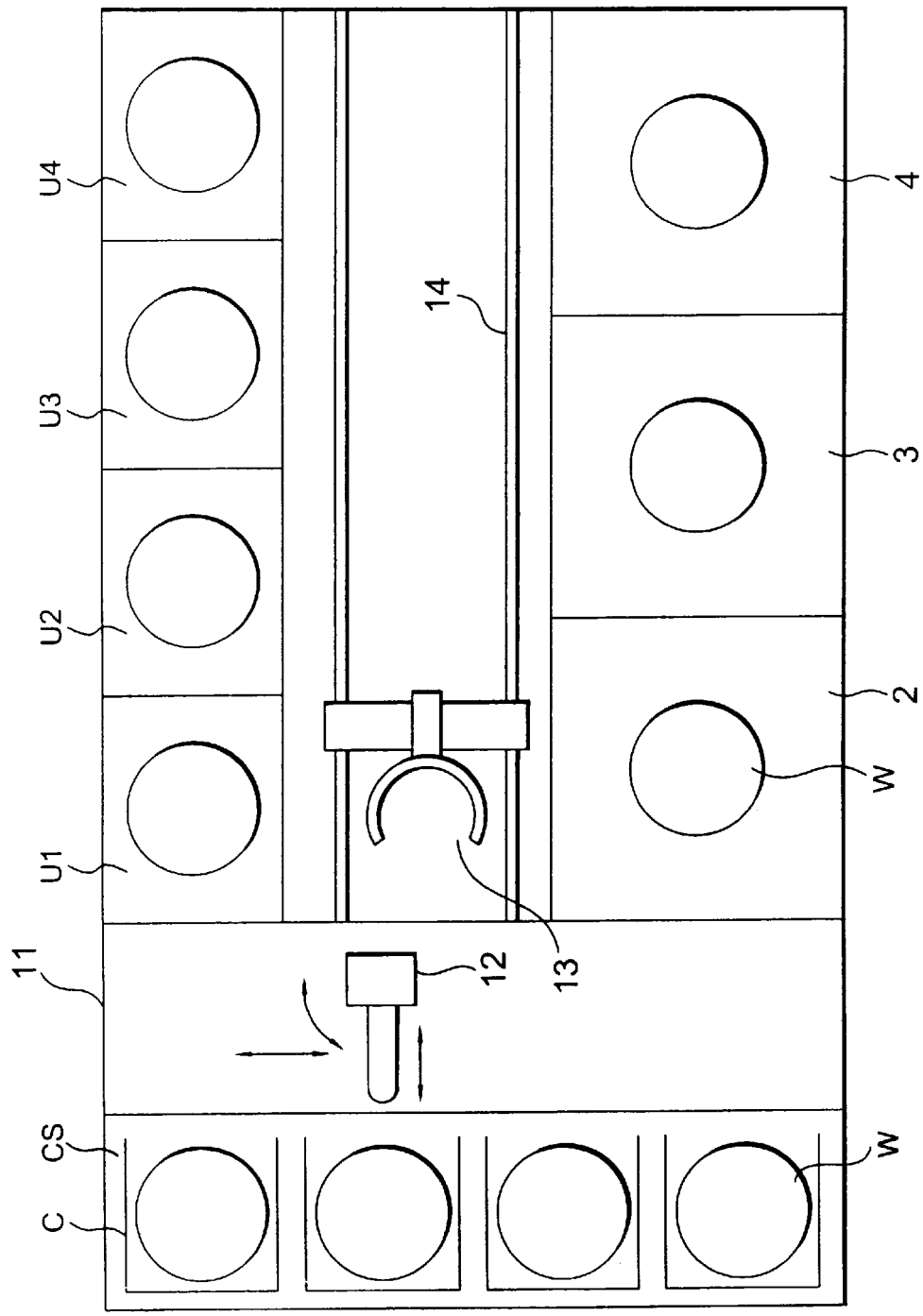
FIG. 1 is a plan view showing an overall structure of a gas treatment apparatus according to a first embodiment of the present invention.

FIG. 1 is a plan view showing an overall structure of a gas treatment apparatus according to a first embodiment of the present invention.

Referring to FIG. 1, reference numeral 11 is an input/output port for a wafer W that is a substrate. A transferring arm 12 extracts a wafer W from a cassette C disposed on a cassette stage CS and transfers the wafer W to a main arm 13.

A coating unit 2 that is a major portion of the gas treatment apparatus according to the embodiment of the present invention is disposed on one side of a transferring path (guide rail) 14 of the main arm 13 along with an aging unit 3 that is a gelatinization treating portion and a solvent substituting unit 4 that is a solvent substituting portion. Treatment units U1 to U4 are disposed on the other side of the transferring path 14. The treatment units U1 to U4 are assigned a hydrophobic treatment, a cooling treatment, a heat treatment (baking treatment), and so forth.

Figure 2A:
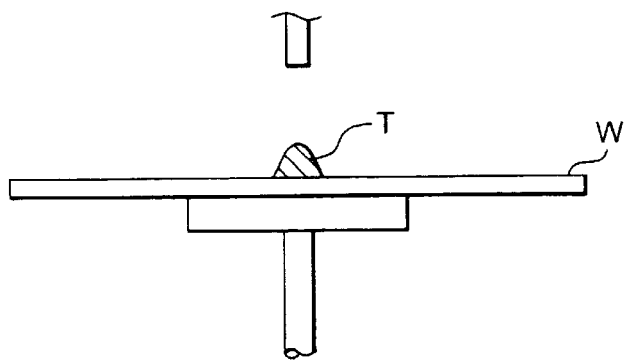
FIGS. 2A, 2B, 2C, and 2D are schematic diagrams for explaining a flow of treatments of the gas treatment apparatus according to the first embodiment.
Figure 2B:
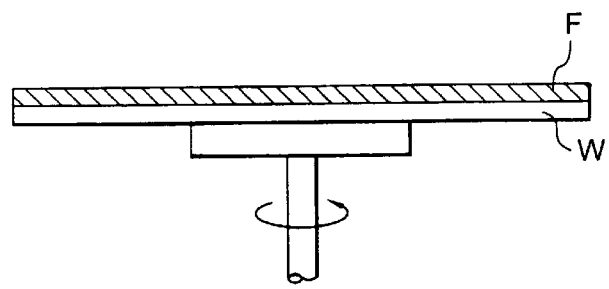

Next, the overall operation of the gas treatment apparatus will be described in brief. A wafer W that is extracted from a cassette C of the cassette stage CS is placed in the coating unit 2. Coating solution T of which colloid or particles of TEOS are dispersed to solvent is dropped to the front surface of the wafer W (refer to FIG. 2A). Since the wafer W is rotated at high speed, the coating solution T spreads out on the front surface of the wafer W and thereby a coated film F is formed (refer to FIG. 2B).

Figure 2C:
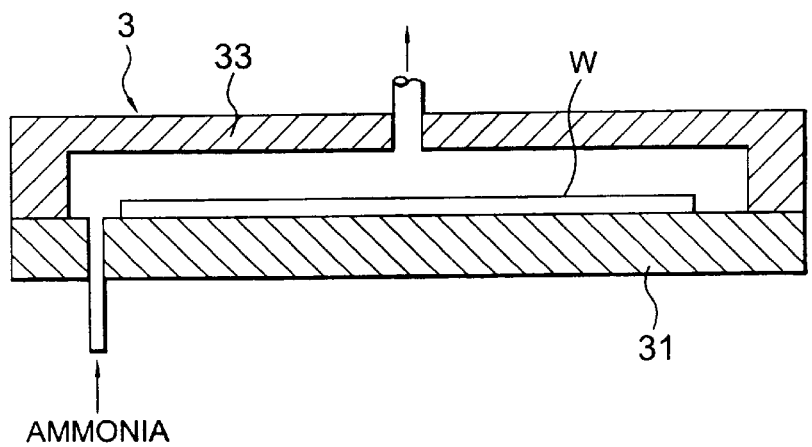

Next, the wafer W is placed on a heating plate 31 of the aging unit 3. The aging unit 3 is sealingly closed with a lid 33. Alkaline gas (for example, ammonia gas) is supplied to the aging unit 3 so as to Gelatinize the coated film (refer to FIG. 2C).

Figure 2D:
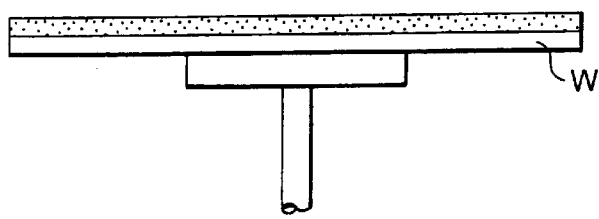

Thereafter, as shown in FIG. 2D, in the solvent substituting unit 4, solvent substituting treatment is performed for the solvent of the gelatinized coated film with ethylalchol, HMDS (hyxamethyldisilane), and heptane. Thus, moisture of the coated film is substituted with ethylalchol. HMDS causes a hydroxyl group of the coated film to be removed. In addition, the solvent in the coated film is substituted with heptane. With solvent whose surface tension is low (such as heptane), since force applied to a porous structure (namely, a mesh structure of TEOS) is small, the porous structure can be prevented from breaking. Thereafter, the wafer W is baked by the baking unit for one minute. Thus, an inter-layer insulation film as a silicon oxide film is formed on the front surface of the wafer W.

Next, the aging unit (gelatinization treating portion) 3 according to the first embodiment of the present invention will be described.

Figure 3A:
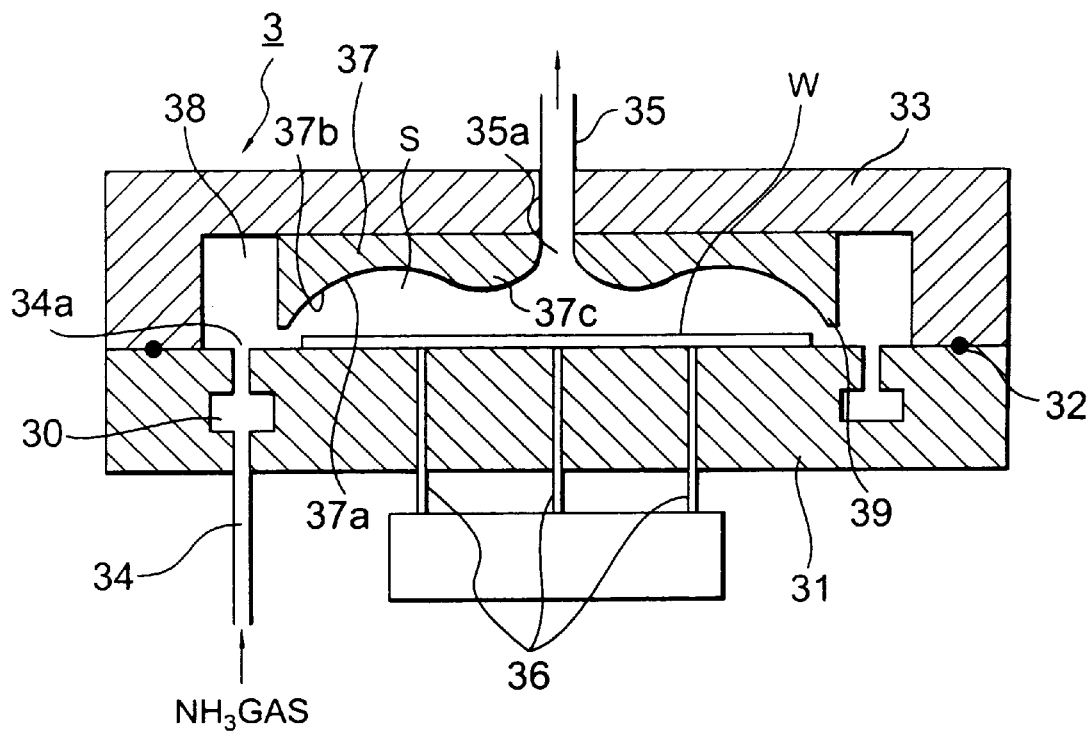
FIGS. 3A and 3B are vertical sectional views showing an example of the structure of an aging unit and a gas flow of the gas treatment apparatus according to the first embodiment of the present invention.

As shown in FIG. 3A, the aging unit 3 comprises a plate 31, a lid 33, a gas supplying path 34, a gas flow regulating member 37, and an exhausting path 35. A wafer W is placed on the plate 31. The lid 33 composes a sealing vessel along with the plate 31 and a seal member 32 that is disposed on the periphery of the plate 31 and that causes the lid 33 to seal the plate 31. The gas supplying path 34 is connected to the sealing vessel through a gas supplying opening 34a that is open to the front surface of the wafer W. The gas flow regulating member 37 regulates the flow of gas supplied from the gas supplying opening 34a. The exhausting path 35 is pierced at the center of the lid 33 and the gas flow regulating member 37.

The aging unit 3 has three wafer raising pins 36 that cause the wafer W to be raised from the plate 31.

The gas flow regulating member 37 has a gas flow regulating surface portion 37a that is formed on the inner surface of the lid 33. The gas flow regulating surface portion 37a faces a treatment surface of the wafer W (namely, the upper surface on which a film has been coated). The gas supplying opening 34a is formed in a slit shape on the periphery of the gas flow regulating surface portion 37a.

Thus, the gas is equally supplied from the peripheral portion of the wafer W and exhausted from the exhausting opening 35a. When the gas supplying opening 34a is composed of several holes rather than the slit-shaped opening, the hole pattern may affect the thickness of the coated film. Thus, the gas supplying opening 34a is preferably formed in the slit shape. As long as the pattern of gas supplying holes is not transferred to the coated film, the gas supplying opening may be composed of many gas supplying holes.

The gas flow regulating surface portion 37a has an inclined surface portion 37b formed in such a manner that the distance from the inclined surface portion 37b to the front surface is reversely proportional to the distance from the center of the wafer W. In other words, the inclined surface portion 37b is formed in a concave shape. In the example shown in FIG. 3A, the gas flow regulating surface portion 37a is most apart from the front surface of the wafer W in the middle from the periphery of the wafer W to the center portion of the sealing vessel. In addition, the gas flow regulating surface portion 37a downwardly protrudes at a portion surrounding the exhausting opening 35a so that the gas flow regulating surface portion 37a is close to the front surface of the wafer W. In other words, a convex portion 37c is formed on the periphery of the exhausting opening 35a.

In the example shown in FIG. 3A, the gas flow regulating member 37 surrounds a space S as a treatment chamber between the gas flow regulating surface portion 37a and the treatment surface of the wafer W. The gas flow regulating member 37 has a partitioning portion 39 formed outside the space S as a peripheral buffer chamber 38. The lower edge of the partitioning portion 39 is connected to the gas flow regulating surface portion 37a. A space is peripherally formed between the lower edge of the partitioning portion 39 and the plate 31 so as to supply the gas to the treatment chamber. The space is a gas supplying opening in the treatment chamber of the claim.

The buffer chamber 38 is connected to the gas supplying opening 34a. The buffer chamber 38 is connected to the space S as the treatment chamber in the vicinity of the wafer W. Thus, the gas supplied from the gas supplying opening 34a to the buffer chamber 38 laterally flows from the periphery of the wafer W to the center of the buffer chamber 38 in the treatment chamber (space S).

Figure 3B:
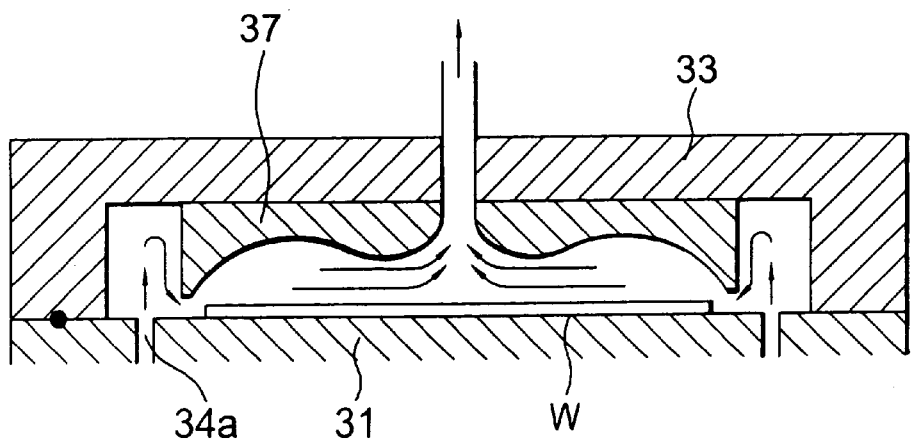

The gas supplying path 34 pierces the plate 31. In addition, the gas supplying path 34 has a gas dispersing chamber 30 in the plate 31. The gas dispersing chamber 30 disperses the gas. The dispersed gas is supplied to the sealing vessel through the slit-shaped gas supplying opening 34a. In FIGS. 3A and 3B, for simplicity, only one gas supplying path 34 is illustrated. Alternatively, a plurality of gas supplying paths 34 (for example, three gas supplying paths 34) may be disposed.

Next, the operation of the aging unit 3 shown in FIGS. 3A and 3B will be described.

A wafer W is transferred from the coating unit 2 to the aging unit 3 by the main arm 13. The wafer W is placed on the plate 31 through the wafer raising pins 36. Thereafter, the aging unit 3 is closed with the lid 33. As shown in FIG. 3B, for example, ammonium gas is temporarily supplied from the gas supplying opening 34a to the buffer chamber 38. The ammonium gas laterally flows from the periphery of the wafer W to the treatment chamber. The gas supplying opening 34a upwardly opens. The gas is temporarily stored in the buffer chamber 38. Thereafter, the gas laterally flows from the buffer chamber 38 to the space S as the treatment chamber. Thus, a lateral flow of the gas from the periphery of the wafer W to the center portion thereof is formed. The gas spreads out and flows to the exhausting opening 35a at the center of the upper portion of the treatment chamber. The gas that upwardly spreads out smoothly flows to the inside of the treatment chamber along the inclined surface portion 37b. Thereafter, the convex portion 37c formed in the vicinity of the exhausting opening 35a causes the gas to downwardly flow to the wafer W so as to prevent the gas from being diluted in the vicinity of the center of the wafer W. Thus, an equal gas flow is formed along the front surface of the wafer W.

Since ammonia gas is supplied to the front surface of the wafer W, a treatment for gelatinizing colloid of TEOS in the coated film and connecting it as a mesh structure is accelerated. Since the ammonia gas causes colloid of TEOS to be acceleratingly gelatinized as an alkaline catalyst, it is not always necessary to heat the ammonium gas. However, the ammonium gas may be heated.

In the first embodiment, since an equal gas flow is formed along the front surface of the wafer W, the gelatinizing treatment can be equally performed for the wafer W. Thus, a high-quality thin film (for example, inter-layer insulation film) can be obtained.

In this example, the gas supplied from the gas supplying opening 34a is ammonium gas. To suppress solvent in the coated film from vaporizing, vapor of solvent (for example, ethylene glycol) may be supplied along with ammonium gas. In the above-described gelatinizing treatment, the wafer may be heated at for example 100° C. so as to acceleratingly gelatinize the coated film of the wafer W.

In this case, to suppress the solvent in the coated film from vaporizing, for example vapor of ethylene glycol should be supplied. For example, a wafer W is placed on a plate that has an internal heater. In addition, the temperatures of pipes and a vapor generating source should be adjusted so that saturated vapor of ethylene glycol is generated at the temperature of the treatment chamber S. In this case, since vapor of ethylene glycol sufficiently spreads out to the center portion of the wafer W, the solvent of the coated film can be suppressed from unequally vaporizing.

According to the first embodiment of the present invention, the gas flow regulating member is not limited to the structure shown in FIG. 3A.

Figure 4:
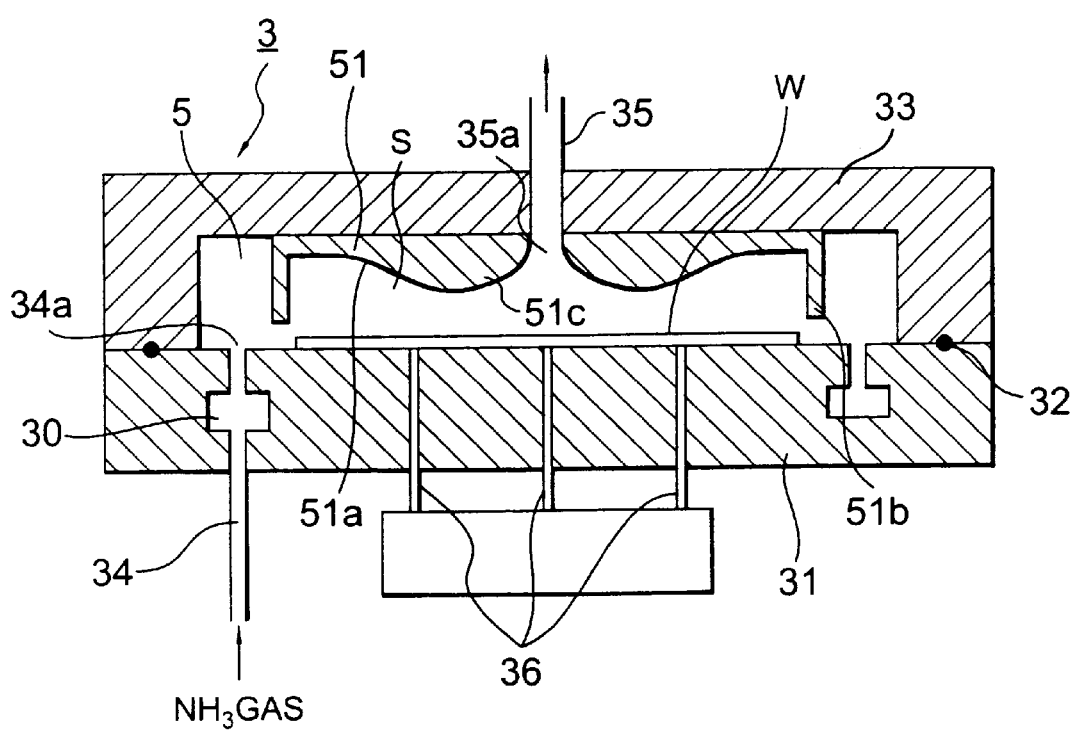
FIG. 4 is a vertical sectional view showing another example of the structure of the aging unit of the gas treatment apparatus according to the first embodiment of the present invention.

Alternatively, as shown in FIG. 4, a gas flow regulating member 51 may have a partitioning plate portion 51b, a gas flow regulating surface portion 51a, and a convex portion 51c. The partitioning plate portion 51b partitions a buffer chamber 38. The partitioning plate portion 51b is connected to the gas flow regulating surface portion 51a. The gas flow regulating surface 51a has a convex portion 51c. The convex portion 51c is formed in such a manner that the distance between the convex portion 51c and the front surface of the wafer W is proportional to the distance from the center portion of the wafer W. The convex portion 51c is formed in a peripheral area of an exhausting opening 35a as with the gas flow regulating member 37 shown in FIGS. 3A and 3B.

In this case, the gas flow regulating member 51 shown in FIG. 4 does not have an inclined surface portion, a vortex flow may take place at the upper portion of the outer periphery of the gas flow regulating member 37 in comparison with the structure shown in FIG. 3A. Except for such a drawback, the gas flow regulating member 51 shown in FIG. 4 has the same effect as that shown in FIG. 3A. Thus, a sufficiently equal gas flow is formed.

Figure 5:
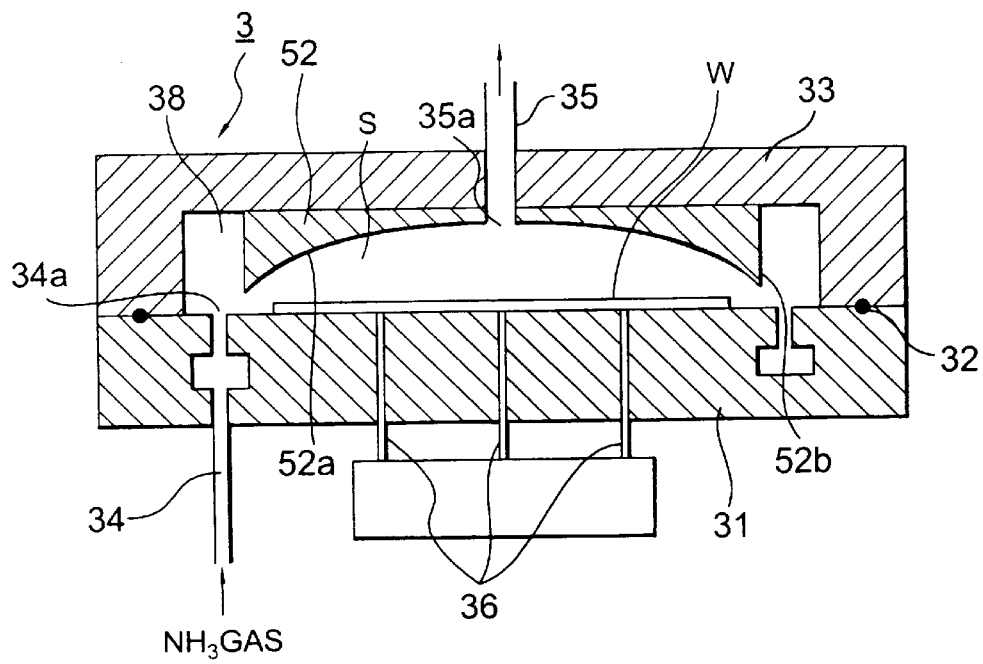
FIG. 5 is a vertical sectional view showing another example of the structure of the aging unit of the gas treatment apparatus according to the first embodiment of the present invention.

As shown in FIG. 5, a gas flow regulating member 52 may have a gas flow regulating surface portion 52a and a partitioning portion 52b. The gas flow regulating surface portion 52a is formed in a sphere shape of which the lower edge of a partitioning portion 52b that partitions a buffer chamber 38 is connected to an exhausting opening 35a in an upper convex shape (or a lower concave shape).

Figure 6:
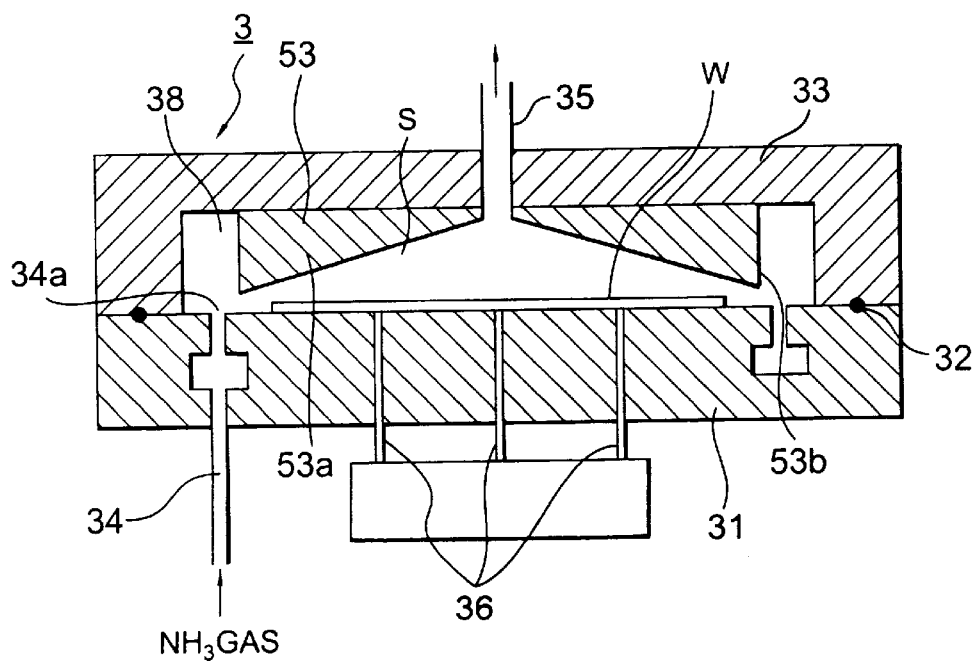
FIG. 6 is a vertical sectional view showing another example of the structure of the aging unit of the gas treatment apparatus according to the first embodiment of the present invention.

Alternatively, as shown in FIG. 6, a gas flow regulating member 53 may have a gas flow regulating surface portion 53a and a partitioning portion 53b. The gas flow regulating surface portion 53a is formed in a circular cone shape of which the lower edge of a partitioning portion 53b and an exhausting opening 35a are connected in a straight line shape. In the structures shown in FIGS. 4, 5, and 6, although the gas supplying effect to the center portion of the wafer W is weaker than that of the structure shown in FIGS. 3A and 3B, the other effects thereof can be obtained. In other words, in the structures shown in FIGS. 4, 5, and 6, a sufficiently equal gas flow can be obtained.

Figure 7:
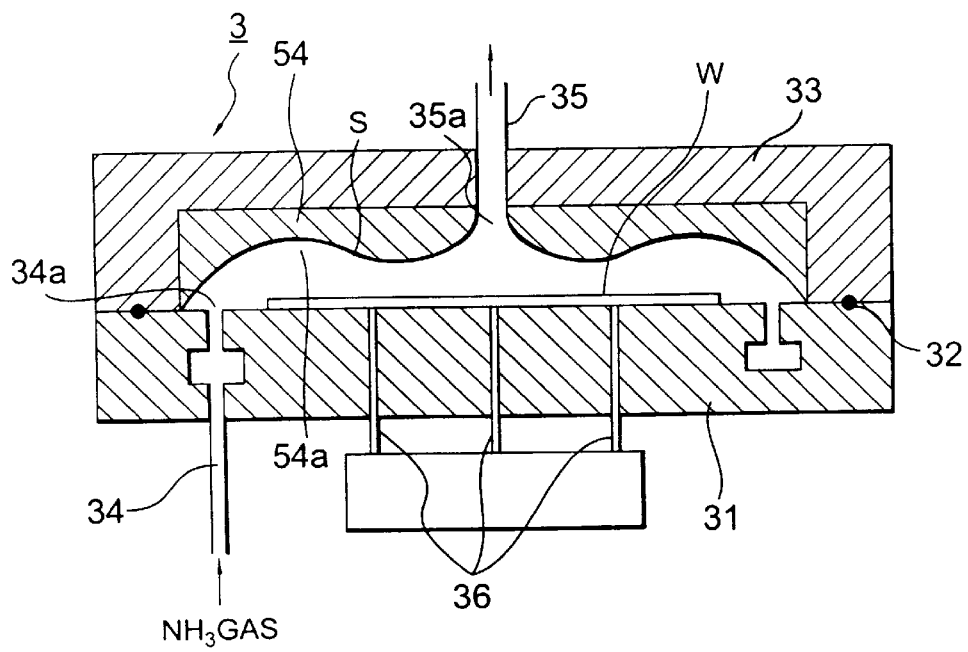
FIG. 7 is a vertical sectional view showing another example of the structure of the aging unit of the gas treatment apparatus according to the first embodiment of the present invention.

Alternatively, as shown in FIG. 7, a gas flow regulating member 54 may not have a partitioning portion equivalent to the partitioning portion 37b shown in FIG. 3A. Thus, in the example shown in FIG. 7, since the structure shown in FIG. 7 does not have a buffer chamber, since gas does not laterally flow, the effect for forming an equal gas along the wafer W slightly deteriorates. Except for this drawback, the same effects as the structure shown in FIG. 3A can be obtained. In other words, a sufficiently equal gas flow can be obtained. The shape of a gas flow regulating surface portion 54a of the gas flow regulating member 54 is not limited. However, the shape is for example the same as that of the structure shown in FIG. 3A.

Figure 8:
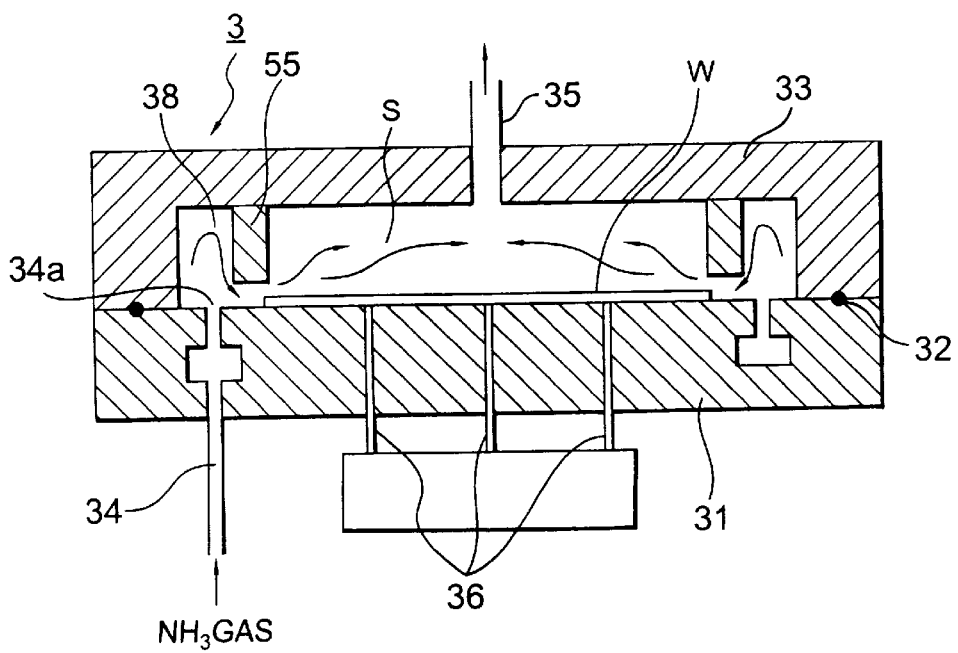
FIG. 8 is a vertical sectional view showing another example of the structure of the aging unit of the gas treatment apparatus according to the first embodiment of the present invention.
Figure 9A:
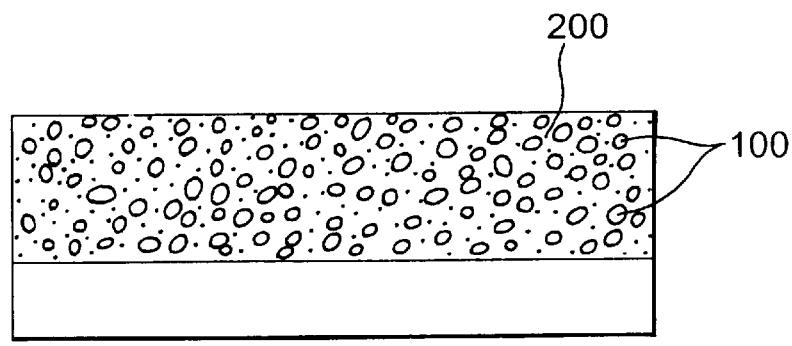
FIGS. 9A, 9B, and 9C are sectional views showing degeneration of a coated film in sol-gel method.
Figure 9B:
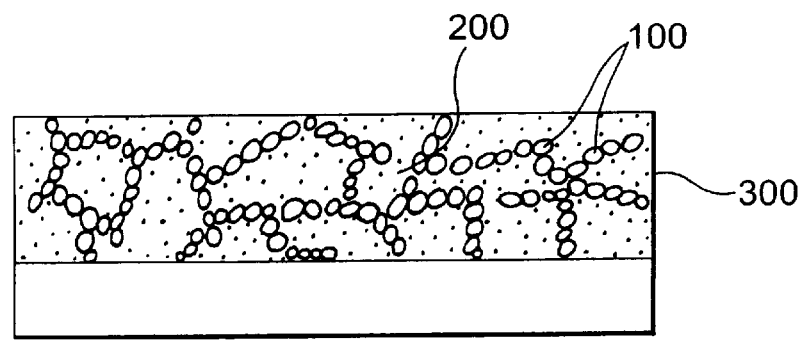
Figure 9C:
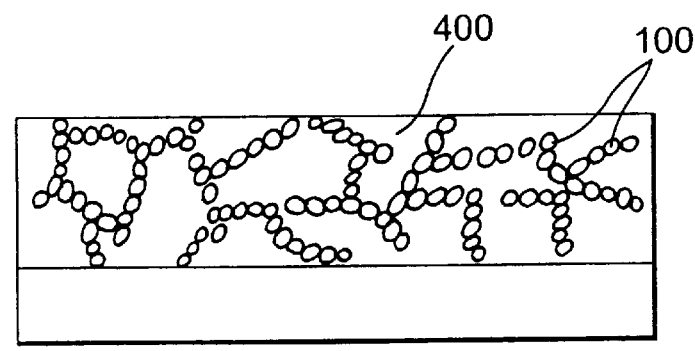
Figure 10:
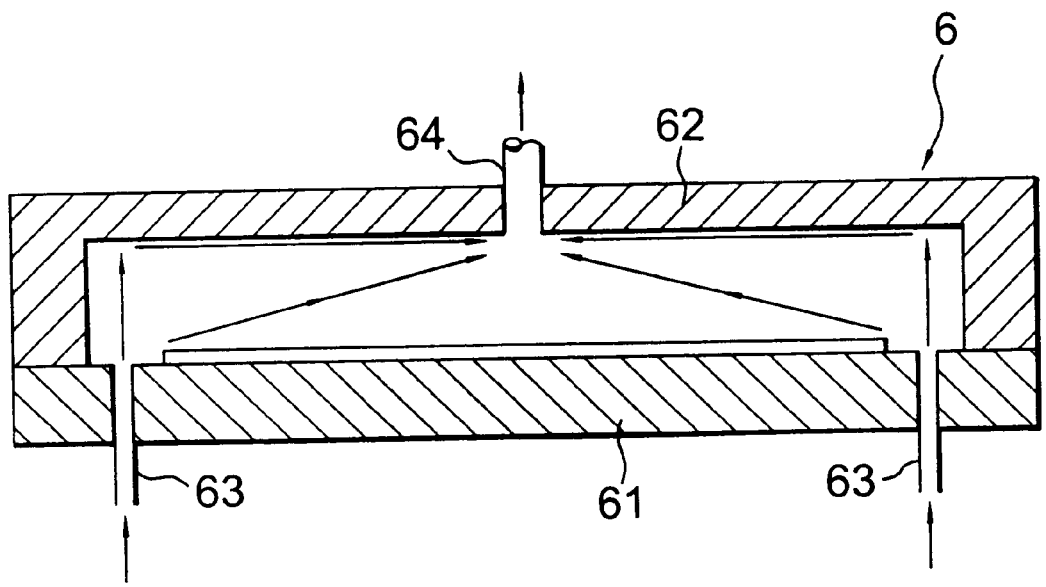
FIG. 10 is a vertical sectional view showing the structure of an aging unit according to a compared example of the first embodiment of the present invention.

As shown in FIG. 8, only a partitioning portion 55 equivalent to the partitioning portion 37b shown in FIG. 3A may be formed. When gas is directly supplied to the treatment chamber without the partitioning portion 55, a vortex flow takes place at a position opposite to the gas supplying opening 34a. However, in this example, since the partitioning portion 55 causes gas to laterally to flow, the vortex flow is suppressed from taking place. Thus, a equal gas flow is formed along the front surface of the wafer W. In this case, when the space between the lower edge of the partitioning portion 55 and the plate 31 is adequately adjusted, the equality of the gas flow can be improved.

According to the first embodiment of the present invention, the gas flow regulating member 37, 51, 52, 53, and 54 and the partitioning portion 55 may be integrally formed with the lid 33. Alternatively, the gas supplying opening may be formed on a side surface of the wafer W (for example, a side plate portion of the lid 33 or a ceiling plate portion thereof). The substrate may be a glass substrate for use with a liquid crystal display rather than a wafer. The gas treatment may be another treatment such as an etching treatment rather than the gelatinizing treatment.

According to the first embodiment of the present invention, a substrate such as a wafer can be treated with an equal gas flow in a sealing vessel. Thus, a high-quality thin film (for example, inter-layer insulation film) can be obtained.

In other words, according to the first embodiment of the present invention (refer to claim 1), an outer peripheral portion of a gas flow regulating surface portion protrudes to a holding portion. A partially narrow gas path is formed between the outer peripheral portion of the gas flow regulating surface portion and the holding portion. Thus, gas supplied from a gas supplying opening does not form a vortex flow just above the gas supplying opening. Consequently, the gas supplied from the gas supplying opening equally flows from the outer periphery of the substrate to the center thereof through the gas path. Thus, a film with equal quality can be obtained.

According to a first modification of the first embodiment of the present invention (refer to claim 2), a buffer chamber is formed outside the outer peripheral portion of the substrate and above the gas supplying opening. Thus, the gas supplied from the gas supplying opening equally flows from the outer periphery of the substrate to the center thereof through the buffer chamber and the gas path. Consequently, the coated film on the substrate is equally treated with the gas. As a result, a film with equal quality can be obtained.

According to a second modification of the first embodiment of the present invention (refer to claim 3), gas supplied from the gas supplying opening flows to the center of the substrate through the buffer chamber and the gas path. At this point, the gas flows through an almost spherical concave portion of the gas flow regulating surface portion in the vicinity of the outer periphery of the substrate. Thus, although the gas flow is temporarily apart from the upper surface of the substrate, the gas flows along an almost doughnut shaped convex portion in the vicinity of the center of the substrate. Consequently, the gas flow approaches the front surface of the substrate. Thus, since the entire substrate equally contacts the gas, the concentration of the gas can be prevented from decreasing in the vicinity of the substrate. As a result, the coated film on the substrate is equally treated with the gas. Thus, a film with equal quality can be obtained.

According to a third modification of the first embodiment of the present invention (refer to claim 4), the gas supplied from the gas supplying opening flows to the center of the substrate through the buffer chamber and the gas path. At this point, the gas flows through an almost plane shaped outermost peripheral portion of a gas flow regulating surface portion in a cylindrical space in the vicinity of the outer periphery of the substrate. Thus, the gas flow is temporarily apart from the front surface of the substrate. Since the gas flows through an almost doughnut shaped convex portion in the vicinity of the center of the substrate, the gas flow approaches the front surface of the substrate. Thus, the concentration of the gas is prevented from decreasing in the vicinity of the center of the substrate. The entire substrate equally contacts the gas flow. Consequently, the coated film on the substrate is equally treated with the gas. As a result, a film with equal quality can be obtained.

According to a fourth modification of the first embodiment (refer to claim 5), the gas supplied from the gas supplying opening flows to the center of the substrate through the buffer chamber and the gas path. At this point, the gas flow regulating surface portion has an almost spherical concave portion on the inner peripheral side thereof. Thus, the direction and flow rate of the gas that flows from the outer periphery of the substrate to the center thereof are stable. Consequently, an equal gas flow is formed. As a result, the coated film on the substrate is equally treated with the gas. Thus, a film with equal quality can be obtained.

According to a fifth modification of the first embodiment of the present invention (refer to claim 6), gas supplied from the gas supplying opening flows to the center of the substrate through the buffer chamber and the gas path. At this point, the gas flow regulating surface portion has a concave portion with a vertex of the gas exhausting portion. Thus, the direction and flow rate of the gas that flows from the outer periphery of the substrate to the center thereof are stable. Consequently, an equal gas flow is formed. Since the coated film on the substrate is equally treated with the gas, a film with equal quality can be obtained.

According to a sixth modification of the first embodiment of the present invention (refer to claim 7), the gas supplied from the gas supplying opening flows to the center of the substrate through the buffer chamber and the gas path. At this point, the gas flows through an almost plane shaped outermost portion of the gas flow regulating portion in the space of the cylindrical shape in the vicinity of the outer periphery of the substrate. Thus, the gas flow is temporarily apart from the front surface of the substrate. Thereafter, the gas flows in the radial direction along the front surface of the substrate in the vicinity of the outer periphery of the substrate. On the other hand, since the exhausting opening is formed in the vicinity of the center of the substrate, the gas stably flows from the outer periphery of the substrate to the center thereof. As a result, the coated film on the substrate is equally treated with the gas. Thus, a film with equal quality can be obtained.

According to a seventh modification of the first embodiment of the present invention (refer to claim 8), the gas supplied from the gas supplying opening flows to the center of the substrate through the gas path. At this point, the gas flows through a nearly sphere shaped concave portion of the gas flow regulating surface portion in the vicinity of the outer periphery of the substrate. Thus, the gas flow is temporarily apart from the front surface of the substrate. However, since the gas flows through a doughnut shaped convex portion, the gas flow approaches the front surface of the substrate. Thus, the concentration of the gas is prevented from decreasing in the vicinity of the center of the substrate. Consequently, the gas equally contacts the entire substrate. As a result, since the coated film on the substrate is equally treated with the gas, a film with equal quality can be obtained.

According to an eighth modification of the first embodiment of the present invention (refer to claim 9), since the gas supplying opening is peripherally formed in a slit shape on the sealing vessel, a gas flow becomes stable. Thus, since the coated film on the substrate is equally treated with the gas, a film with equal quality can be obtained.

According to a ninth modification of the first embodiment of the present invention (refer to claim 10), the sealing vessel is composed of a first member and a second member. The holding portion is formed on the first member. The gas flow regulating portion is formed on the second member. The second member is approachable to the first member. Thus, the space between the gas flow regulating surface portion and the front surface of the substrate can be adjusted. Consequently, an adequate gas flow can be formed. As a result, since the coated film on the substrate is equally treated with the gas, a film with equal quality can be obtained.

According to a tenth modification of the first embodiment of the present invention (refer to claim 11), since the gas supplying path is formed through the first member, the space between the gas supplying path and the gas flow regulating surface portion can be adjusted. Thus, an optimum gas flow can be formed. Consequently, since the coated film on the substrate is equally treated with the gas, a film with equal quality can be obtained.

According to an eleventh modification of the first embodiment of the present invention (refer to claim 12), a coating solution of which particles or colloid of a start substance of a film component has been dispersed to solvent is coated on the substrate. Thus, a coated film is formed. In the sealing vessel, the gas is used so as to acceleratingly gelatinizing the particles or colloid of the coated film.

Thus, when the gelatinizing condition of the coated film in the gas treatment is optimized, a coated film with equal quality can be formed.

According to a twelfth modification of the first embodiment of the present invention (refer to claim 13), the gas is alkaline gas.

Thus, when the gelatinizing condition of the coated film in the gas treatment is optimized, a coated film with equal quality can be formed.

(Second Embodiment)

Next, a second embodiment of the present invention will be described. For simplicity, in the second embodiment, the description of similar portions to those in the first embodiment will be omitted.

Figure 11:
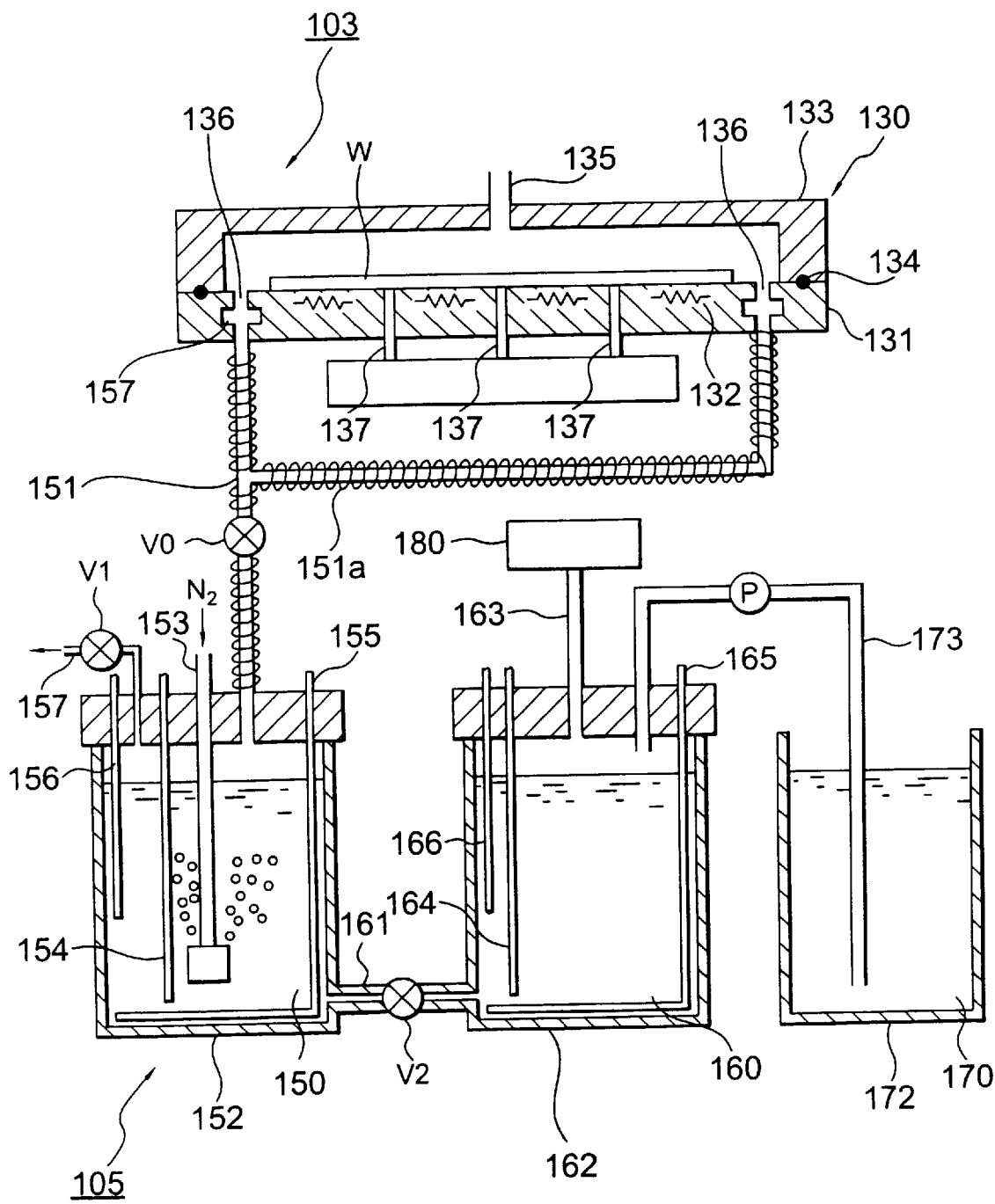
FIG. 11 is a vertical sectional view showing an example of the structure of a gas treatment apparatus according to a second embodiment of the present invention.
Figure 12:
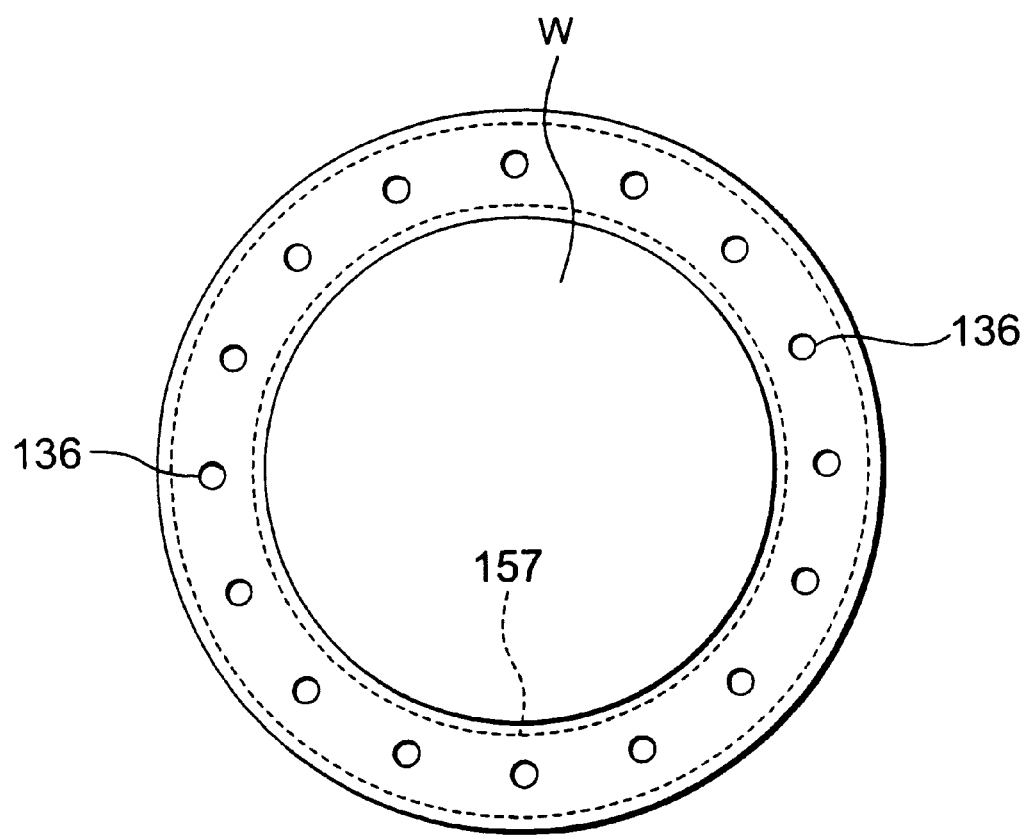
FIG. 12 is a plan view showing the interior of a sealing vessel of the gas treatment apparatus according to the second embodiment of the present invention.

FIG. 11 is a schematic diagram showing an outlined structure of an aging unit (a coated film treating unit) 103 according to the second embodiment of the present invention. FIG. 12 is a plan view of the aging unit 103.

As shown in FIG. 11, the aging unit 103 comprises a heating plate 131, a lid 133, and an exhausting path 135. A wafer W is placed on the heating plate 131. The heating plate 131 has an inner heater 132 as a heating means. A seal member 134 is disposed on the periphery of the heating plate 131. The lid 133 composes a sealing treatment vessel 130 along with the seal member 134 and the heating plate 131. An exhausting path 135 is open at a center portion of the lid 133. A heating means is preferably disposed in the lid 133. A plurality of (for example, 15) gas supplying openings 136 are distributively formed along the outside of the periphery of the wafer W (refer to FIG. 12). A plurality of (for example, three) wafer raising pins 137 for raising the wafer W in a space formed between the sealing vessel 130 and the heating plate 131 are disposed on the heating plate 131.

The heating plate 131 is composed of a material with large heat capacity so as to suppress a temperature fluctuation due to heat exchange as a disturbance. The hating plate 131 is composed of aluminum and ceramics (for example, SiC) in such a manner that aluminum is coated with ceramics. According to the second embodiment of the present invention, the thickness of the heating plate 131 is not limited. In this example, the thickness of the heating plate 131 is for example 4 cm. Thus, while the gelatinizing treatment is being performed, the temperature of the heating plate 131 is always kept at an almost constant temperature.

Solvent vapor generating portion 105 is connected to the gas supplying openings 136 of the sealing vessel 130. The solvent vapor generating portion 105 has a heating babbler that generates solvent vapor at a predetermined temperature. The solvent vapor is supplied to the sealing vessel 130. A gas dispersing chamber 157 is formed in the middle of the gas supplying path 151 so as to equally supply the solvent vapor to the plurality of gas supplying openings 136.

The gas dispersing chamber 157 is formed in a ring shape along the outer periphery of the wafer W placed on the heating plate 131. The gas supplying path 151 branches on the side of the solvent vapor generating portion 105. The branched paths are connected at two opposite positions in the diametrical direction of the vessel 130 (refer to FIG. 12).

Thus, the inner temperature of the gas dispersing chamber is almost the same as the temperature of the heating plate 131 (namely, the temperature of the gelatinizing treatment). In addition, the gas supplying path 151 is provided with a valve V0 and a tape heater 151a. The valve V0 is disposed in the middle of the gas supplying path 151. The tape heater 151a is a heating means that is wound around the gas supplying path 151.

The solvent vapor generating portion 105 comprises a bubbling tank (first reservoir tank) 152, a bubbling gas supplying pipe 153, a liquid level sensor 154, a heater 155, a temperature sensor 156, and a pressure relief pipe 157. The bubbling tank 152 reserves solvent 150 such as ethylene glycol. The bubbling gas supplying pipe 153 blows carrier gas such as $N_2$ supplied from a bubbling gas supplying unit (not shown) to the solvent 150 and bubbles the solvent 150. The liquid level sensor 154 detects the liquid level of the solvent 150. The heater 155 heats the solvent 150 so that the temperature of the solvent 150 is slightly higher than the temperature of the sealing vessel 130. The temperature sensor 156 detects the temperature of the solvent 150 heated by the heater 155. The pressure relief pipe 157 has a valve V1 for relieving the inner pressure of the tank 152 when the solvent is replenished to the tank 152.

The solvent temperature detected by the temperature sensor 156 is fed back to a controlling portion (not shown). The controlling portion turns on/off the heater 155. Thus, the heater 155 and the temperature sensor 156 function as a first temperature adjusting means. The liquid level of the solvent detected by the liquid level sensor 154 is fed back to the controlling portion. Under the control of the controlling portion, the solvent is replenished to the bubbling tank 152.

The solvent vapor generating portion 105 has a temperature adjusting spare tank (second reservoir tank) 162. The temperature adjusting spare tank 162 is connected to the bubbling tank 152 through a connecting portion 161 and a valve V2. The temperature adjusting spare tank 162 reserves solvent 160 such as ethylene glycol. The temperature adjusting spare tank 162 is connected to a pressuring portion 180 through a pipe 163. The controlling portion causes the valve V2 to opened/closed and the pressuring portion 180 to be turned on/off. The pressuring means blows pressured air to the temperature adjusting spare tank 162 and increases the inner pressure of the tank. When the solvent is replenished to the bubbling tank 152, the pressuring means relieves the pressured air of the tank.

As with the bubbling tank 152, the temperature adjusting spare tank 162 has a liquid level sensor 164, a heater 165, and a temperature sensor 166. The heater 165 and the temperature sensor 166 function as a second temperature adjusting means. The second temperature adjusting means and the controlling portion cause the temperature of the solvent 160 in the temperature adjusting spare tank 162 to be kept to the same temperature as the solvent 150 in the bubbling tank 152. When the liquid level sensor 164 detects a decrease of the liquid level of the solvent 160 in the temperature adjusting spare tank 162, the controlling portion causes the solvent to be replenished from the replenish tank 172 connected to the temperature adjusting spare tank 162. The temperature adjusting spare tank 162 has a pressure relief pipe (not shown).

The replenish tank 172 and the temperature adjusting spare tank 162 are connected with a pipe 173 through a pump P such as peri-pump. The pump P is controlled by the controlling portion. Thus, the solvent 170 such as ethylene glycol in the tank is supplied to the temperature adjusting spare tank 162.

Next, the operation of the aging unit 103 will be described. After a wafer W is transferred from the coating unit 102, the wafer W is placed on the heating plate 131 of the aging unit 103. Thereafter, the coating unit 102 is closed with the lid 133. At this point, to acceleratingly gelatinizing a coated film of the wafer W, the wafer W is heated to for example around 100° C. by the heater 132. On the other hand, the solvent 150 in the bubbling tank 152 is heated and kept at a slightly higher temperature by around 1 to 5° C. than the temperature of the wafer W (around 100° C.) When the temperature of the solvent 150 is much higher than the temperature of the wafer W, the temperature of the solvent 150 does not drop in the gas dispersing chamber 157 and thereby condensation takes place in the sealing vessel.

Carrier gas such as $N_2$ is blown to the solvent 150 reserved in the bubbling tank 152 through the bubbling gas supplying pipe 153. Thus, vapor of the solvent component at temperature t1° C. slightly higher than the inner temperature of the sealing vessel (for example, around 100° C.) is generated. The vapor of the solvent component may contain vapor that saturates at the inner temperature of the sealing vessel (for example, 100° C.) rather than temperature t1° C. In other words, it is difficult to obtain perfectly saturated vapor with bubbled solvent. The relative humidity of ethylene glycol is preferably around 100%. The vapor is supplied to the gas supplying path 151. The vapor is kept at temperature t1° C. by the heater 151a wound around the gas supplying path 151. Thereafter, the vapor is supplied to the gas dispersing chamber 157 formed in the heating plate 131.

Since the temperature of the vapor of the solvent component supplied to the gas dispersing chamber 157 is slightly higher than the inner temperature of the gas dispersing chamber 157, the vapor is slightly cooled in the gas dispersing chamber 157 and thereby the vapor super-saturates. In addition, since the temperature of the gas dispersing chamber 157 is almost the same as the temperature of the sealing vessel 130, the vapor of the solvent component that has super-saturated in the gas dispersing chamber 157 occasionally condenses in the gas dispersing chamber 157. The solvent component becomes vapor that saturates or almost saturates at the temperature of the sealing vessel 130. Since the solvent vapor that saturates or almost saturates at the temperature of the sealing vessel 130 is supplied to the sealing vessel, the solvent component does not condense in the sealing vessel 130.

Since the vapor of the solvent component disperses in the gas dispersing chamber 157, the vapor of the solvent component is equally supplied from the plurality of gas supplying openings 136 formed along the periphery of the gas dispersing chamber 157 formed in the ring shape.

Figure 13A:
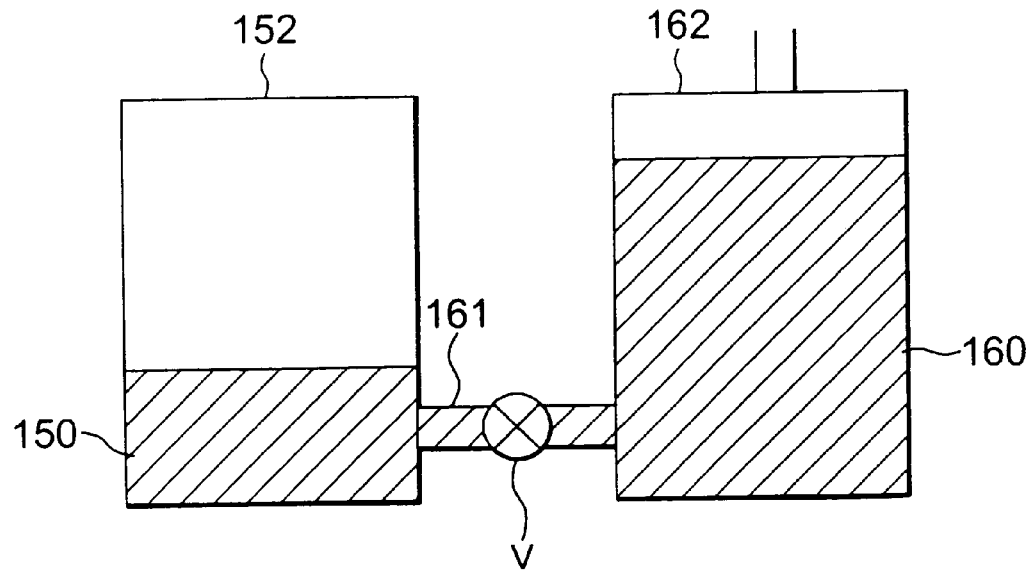
FIGS. 13A and 13B are schematic diagrams for explaining the case that solvent is replenished to a reservoir tank of the gas treatment apparatus according to the second embodiment of the present invention.
Figure 13B:
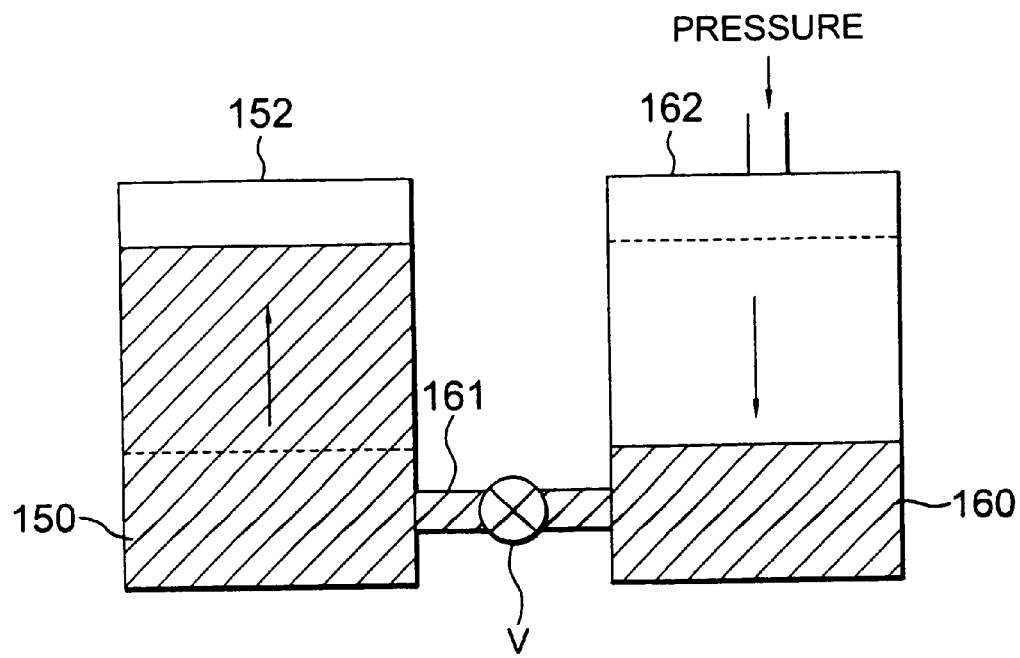

When the liquid level of the solvent 150 in the bubbling tank 152 decreases and the liquid level sensor 154 detects the decrease of the liquid level (refer to FIG. 13A), the controlling unit causes the valve V of the connecting portion 161 that connects the bubbling tank 152 and the temperature adjusting spare tank 162 to be opened. In addition, the controlling portion causes the pressuring portion 180 to increase the inner pressure of the temperature adjusting spare tank 162. Thus, the solvent 160 in the temperature adjusting spare tank 162 is replenished to the bubbling tank 152 through the connecting portion 161 (refer to FIG. 13B). When the liquid level of the solvent 150 in the bubbling tank 152 becomes a predetermined liquid level, the liquid level sensor 154 detects the situation. At this point, the controlling unit causes the valve V of the connecting portion 161 to be closed. In addition, the controlling unit causes the pressuring portion 180 to stop increasing the inner pressure of the temperature adjusting spare tank 162. Thus, the replenishment of the solvent to the bubbling tank 152 is stopped. After the valve V is closed and the pressuring portion 180 is deactivated, the pressured air in the temperature adjusting spare tank 162 is naturally relived.

When the liquid level of the solvent 150 in the bubbling tank 152 is not controlled with the liquid level sensor 154, bubbles of the solvent 150 bubbled with the carrier gas such as $N_2$ shortly disappear. Thus, the concentration of the solvent component in the bubbles does not saturate, but lowers. To prevent such a problem, according to the second embodiment of the present invention, the liquid level of the solvent 150 in the bubbling tank is always kept in a higher level. Thus, the solvent sufficiently bubbles.

Since the temperature of the solvent 160 in the temperature adjusting spare tank 162 is heated and kept at the same temperature as the solvent 150 in the bubbling tank 152 by the heater 165 and the temperature sensor 166. Thus, when the solvent 160 is replenished from the temperature adjusting spare tank 162 to the bubbling tank 150, the temperature of the solvent 150 does not drop.

In the second embodiment of the present invention, the temperature of the solvent 150 is controlled so that when the solvent 160 is replenished from the temperature adjusting spare tank 162 to the bubbling tank 152, the solvent 160 does not cause the temperature of the solvent 150 to drop. Otherwise, the temperature of the solvent 150 in the bubbling tank 152 temporarily drops.

When the temperature of the vapor of the solvent component that saturates with carrier gas such as $N_2$ rises to the temperature of the gas dispersing chamber 157 and the sealing vessel 130, the saturated vapor cannot be obtained at the temperature of the sealing vessel. To prevent this problem, according to the second embodiment of the present invention, the temperature adjusting spare tank 162 is heated and kept at the same temperature as the bubbling tank 152 by the heater 162 and the temperature sensor 166. Alternatively, the supplying pipe connected from the tank 172 to the bubbling tank 152 may be heated instead of using the temperature controlling spare tank 162.

When the liquid level of the solvent 160 in the temperature adjusting spare tank decreases and the liquid level sensor 164 detects the decrease of the liquid level, the controlling unit causes the pump P in the middle of the connecting portion (pipe 173) connected from the temperature adjusting spare tank 162 to the replenish tank 172 to be activated. Thus, the solvent 170 is replenished from the replenish tank 172 to the temperature adjusting spare tank 162. When the liquid level of the solvent 160 in the temperature adjusting spare tank 160 becomes a predetermined liquid level, the liquid level sensor 164 detects the liquid level. At this point, the controlling unit causes the pump P to be deactivated. Thus, the replenishment of the solvent 170 to the temperature adjusting spare tank 162 is stopped.

According to the second embodiment of the present invention, the solvent 150 is heated to a temperature slightly higher than the temperature of the gas dispersing chamber 157 (namely, the sealing vessel) by the solvent vapor generating portion 105 so as to generate vapor that becomes saturated vapor in the sealing vessel. The vapor is supplied to the sealing vessel through the gas dispersing chamber 157. Thus, the vapor of the solvent component is cooled in the gas dispersing chamber 157. Consequently, the vapor super-saturates in the gas dispersing chamber 157. Part of the super-saturated vapor of the solvent component occasionally condenses and is removed. Thus, vapor that saturates at the temperature of the sealing vessel 130 is obtained. The resultant vapor is supplied to the sealing vessel. Thus, when the coated film is gelatinized, the organic solvent can be prevented from vaporizing from the coated film. In addition, the solvent vapor is prevented from condensing on the front surface of the wafer W in the sealing vessel. Consequently, a coated film (particularly, an inter-layer insulation film such as a silicon oxide film) with equal film thickness can be obtained.

According to the second embodiment of the present invention, since the vapor of the solvent component is dispersed by the gas dispersing chamber 157 and equally supplied to the sealing vessel, a coated film (particularly, an inter-layer insulation film such as a silicon oxide film) with more equal film thickness can be obtained.

According to the second embodiment of the present invention, since the solvent 160 is properly replenished from the temperature adjusting spare tank 162 to the bubbling tank 152, the liquid level of the solvent 150 in the bubbling tank 152 is kept in a high position. Thus, bubbles of the solvent 150 sufficiently stay in the bubbling tank 152. In addition, the solvent 160 in the temperature adjusting spare tank 162 is heated and kept at the same temperature as the solvent 150 in the bubbling tank 152. Thus, when the solvent 160 is replenished from the temperature adjusting spare tank 162 to the bubbling tank 152, the solvent 150 in the bubbling tank 152 is always kept at a temperature slightly higher than the inner temperature of the sealing vessel 130. Consequently, vapor whose temperature is slightly higher than the temperature of the gas dispersing chamber 157 and that saturates in the sealing vessel 130 is always supplied to the gas dispersing chamber 157. Excessive vapor of the solvent component condenses in the gas dispersing chamber 157 and is removed. Thus, vapor of the solvent component that saturates or that almost saturates at the temperature of the sealing vessel 130 is supplied thereto.

The second embodiment of the present invention is not limited to the structure shown in FIGS. 11, 12, 13A and 13B. In other words, the second embodiment can be modified in various manners. For example, the bubbling tank 152 and the temperature adjusting spare tank 162 may be surrounded with a resistor heater or the like so as to heat the solvents 150 and 160 in the respective tanks. The structures of the temperature sensors 156 and 166 are not limited as long as they detect the temperatures of the solvents 150 and 160. The gas supplying openings 136 that are open to the heating plate 131 may be formed in a slit shape. In addition, the treatment substrate may be a glass substrate for use with a liquid crystal display as well as a wafer.

Figure 14:
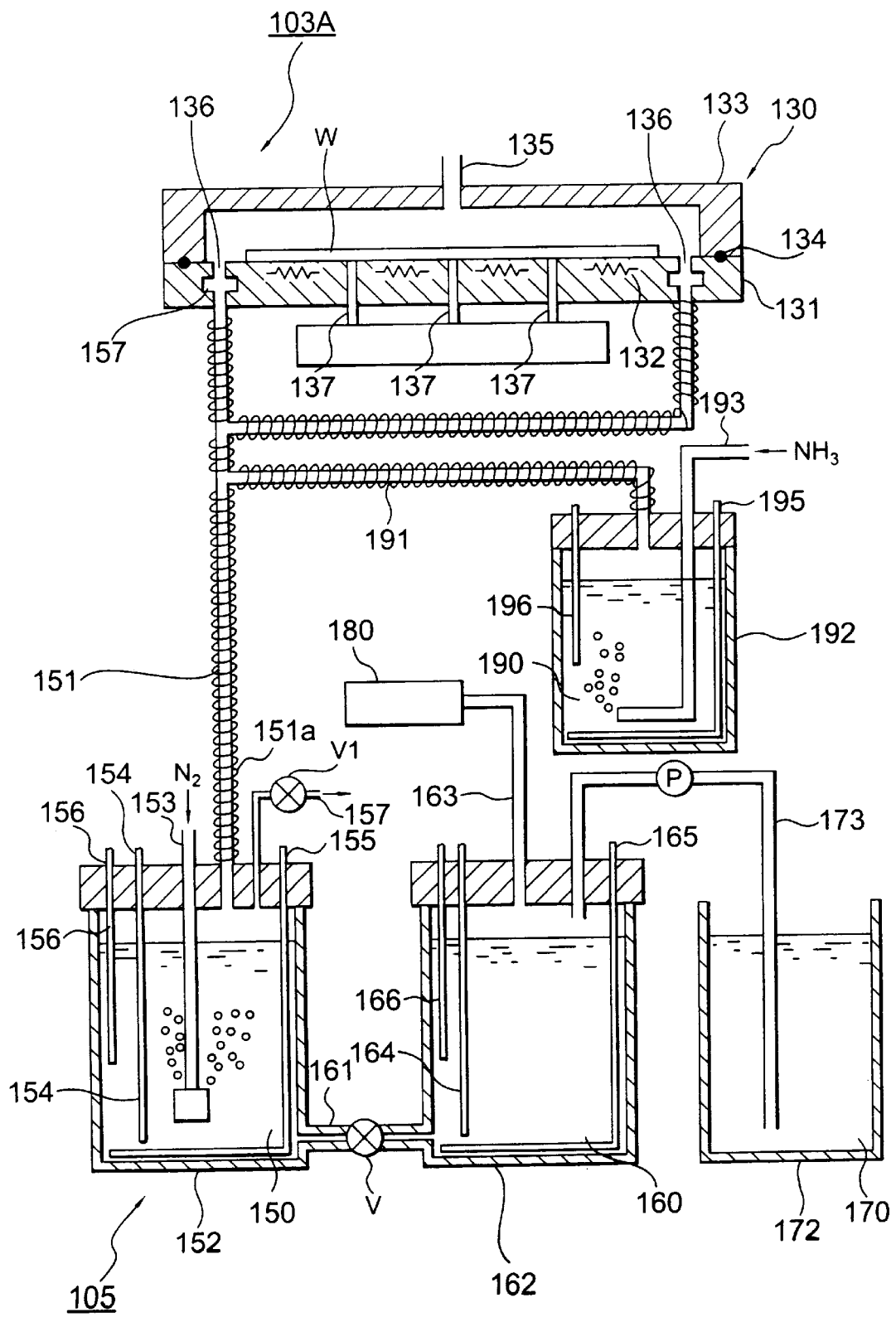
FIG. 14 is a vertical sectional view showing another example of the gas treatment apparatus according to the second embodiment of the present invention.

Moreover, in an aging unit 103A shown in FIG. 14, ammonium gas may be supplied to a sealing vessel 130 along with vapor of a solvent. In this case, ammonium solution 190 (around 30% by weight) is replenished to an alkali reservoir tank 192. Ammonium gas is brown to the ammonium solution 190 through an ammonium gas supplying pipe 193. Thus, ammonium gas that contains 100% of water vapor is generated. The ammonium gas is supplied to a gas supplying path 151 through a pipe 191. At this point, the ammonium solution 190 in the alkali reservoir tank 192 is heated and kept at the same temperature as a bubbling tank 152 by a heater 195 and a temperature sensor 196. The ammonium gas at the same temperature as the vapor of the solvent is supplied to the gas dispersing chamber 157. In the structure shown in FIG. 14, since the ammonium gas acts as alkali catalyst on TEOS and acceleratingly gelatinizes it, the gelatinizing treatment promptly completes and thereby the through-put improves.

Thus, according to the second embodiment, solvent is prevented from vaporizing from a coated film in the gelatinizing treatment. In addition, vapor of the solvent is prevented from condensing on the front surface of a treatment substrate in the sealing vessel. Thus, a thin film (for example, an inter-layer insulation film) with equal film thickness can be obtained.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A gas treatment apparatus, comprising:
   a sealing vessel for treating a substrate with gas;
   a substrate holding portion, disposed in said sealing vessel, for holding the substrate;
   a gas flow regulating surface portion, disposed opposite to a treatment surface of the substrate held on said substrate holding portion, said gas flow regulating surface portion protruding to said substrate holding portion and having at least an outer peripheral portion for forming a narrowed gas path with said substrate holding portion;
   a gas supplying opening disposed along a peripheral portion of said gas flow regulating surface portion; and
   an exhausting opening facing the treatment surface of the substrate held on said substrate holding portion and disposed at a center portion of said sealing vessel.

2. The gas treatment apparatus as set forth in claim 1, further comprising:
   a buffer chamber disposed outside the outer peripheral portion and at an upper portion of said gas supplying opening.

3. The gas treatment apparatus as set forth in claim 2, wherein an inner periphery of said gas flow regulating surface portion is composed of:
   a first concave portion formed in almost a spherical surface shape;
   a convex portion formed inside the first concave portion and protruding in an almost doughnut shape; and
   a second concave portion formed in an almost circular cone shape inside the convex portion and connected to said exhausting opening, and
   wherein the first concave portion, the convex portion, and the second concave portion are inwardly and continuously formed on concentric circles.

4. The gas treatment apparatus as set forth in claim 2, wherein an almost spherical surface shaped concave portion is formed on an inner periphery of said gas flow regulating surface portion.

5. The gas treatment apparatus as set forth in claim 2, wherein said outer peripheral portion forms a partitioning portion with a cylindrical section, and
   wherein an inner periphery of said gas flow regulating surface portion is a plane with almost the same height as a vertex portion of the buffer chamber.

6. A The gas treatment apparatus as set forth in claim 1, wherein the outer peripheral portion is a partition plate that partitions an inner space of said sealing vessel into a cylindrical space facing the treatment surface of the substrate held on said substrate holding portion and a buffer chamber formed outside the cylindrical space, and
   wherein an inner periphery of said gas flow regulating surface portion is composed of:
   an outer portion formed in an almost plane shape;
   an inclined portion formed inside the outer portion, the inclined portion forming a side surface of an almost circularly cone shaped protrusion portion;
   a convex portion formed in an almost doughnut shape inside the inclined portion; and
   a concave portion formed in an almost circularly cone shape inside the convex portion and connected to said exhausting opening, and
   wherein the outer portion, the inclined portion, and the convex portion, and the concave portion are inwardly and continuously formed on concentric circles.

7. The gas treatment apparatus as set forth in claim 1, wherein a circularly cone shaped concave portion with a vertex of said exhausting opening is formed on an inner periphery of said gas flow regulating surface portion.

8. The gas treatment apparatus as set forth in claim 1, wherein an inner periphery of said gas flow regulating surface portion is composed of:
   a first concave portion formed in almost a spherical surface shape;
   a convex portion formed inside the first concave portion and protruding in an almost doughnut shape; and
   a second concave portion formed in an almost circular cone shape inside the convex portion and connected to said exhausting opening, and
   wherein the first concave portion, the convex portion, and the second concave portion are inwardly and continuously formed on concentric circles.

9. The gas treatment apparatus as set forth in claim 1, wherein said gas supplying opening is formed in a slit shape along a peripheral direction of said sealing vessel.

10. The gas treatment apparatus as set forth in claim 1, wherein said sealing vessel is composed of:
    a first member on which said substrate holding portion is disposed; and
    a second member on which said gas flow regulating surface portion is disposed, the second member being approachable to the first member.

11. The gas treatment apparatus as set forth in claim 10, wherein said gas supplying path is formed through the first member.

12. The gas treatment apparatus as set forth in claim 1, wherein a coating solution of which particles or colloid of a start substance of a film component is dispersed to solvent is coated as a coated film on the substrate, and
    wherein gas for accelerating gelatinizing the particles or colloid of the coated film is supplied to said sealing vessel.

13. The gas treatment apparatus as set forth in claim 12, wherein the gas is alkaline gas.

* * * * *

UNITED STATES PATENT AND TRADEMARK OFFICE
CERTIFICATE OF CORRECTION

PATENT NO. : 6,190,459 B1
DATED : February 20, 2001
INVENTOR(S) : Kazuhiro Takeshita, et al.

It is certified that error appears in the above-identified patent and that said Letters Patent is hereby corrected as shown below:

Column 4,
Line 58, change "trough" to -- through --.

Column 6,
Line 32, change "Gelatinize" to -- gelatinize --.

Column 8,
Line 57, change "51cis" to -- 51c is --;
Line 58, change "51cand" to -- 51c and --; and
Line 60, change "51cis" to -- 51c is --.

Column 9,
Line 43, delete the second occurrence "to".

Column 12,
Line 43, change "hating" to -- heating --.

Signed and Sealed this

Thirtieth Day of October, 2001

Attest:

NICHOLAS P. GODICI
Attesting Officer
Acting Director of the United States Patent and Trademark Office